United States Patent
Morgan et al.

(10) Patent No.: US 6,480,029 B2
(45) Date of Patent: Nov. 12, 2002

(54) THREE-VOLT TIA/EIA-485 DRIVER CIRCUIT

(75) Inventors: Mark W. Morgan, Allen, TX (US); Fernando D. Carvajal, Fairview, TX (US); Roy C. Jones, III, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/891,904

(22) Filed: Jun. 26, 2001

(65) Prior Publication Data

US 2002/0021144 A1 Feb. 21, 2002

Related U.S. Application Data

(60) Provisional application No. 60/217,814, filed on Jul. 12, 2000.

(51) Int. Cl.[7] .................... H03K 19/02; H03K 19/01
(52) U.S. Cl. ..................................... 326/56; 326/17
(58) Field of Search ............... 326/56–58, 17–20

(56) References Cited

U.S. PATENT DOCUMENTS 4,678,943 A * 7/1987 Uragami et al. ............ 326/58
5,118,974 A * 6/1992 Yarbrough et al. .......... 326/56
5,338,978 A * 8/1994 Larsen et al. ............... 326/21

* cited by examiner

*Primary Examiner*—Michael Tokar
*Assistant Examiner*—James H. Cho
(74) *Attorney, Agent, or Firm*—J. Dennis Moore; W. James Brady, III; Frederick J. Telecky, Jr.

(57) ABSTRACT

A low voltage 485-driver circuit that meets the standard leakage and 1.5 voltage differential output requirements of the TIA/EIA-485 specification while operating from a 3V supply. The circuit avoids the voltage drop across the series Schottky diodes in the output driver of a conventional 485-driver by moving the Schottky blocking diodes from the output stage signal path to the pre-driver stage so that the output stage is restricted to back-gate biasing only. In addition, the circuit uses stacked NMOS transistors to maintain lower voltage across each NMOS transistor in order to prevent hot-carrier injection. This allows lower voltage rated output NMOS transistors to be used, resulting in higher speed operation. The circuit will withstand excessive common mode voltages in the range of +12V to −7V applied to the output while in either signaling ON state or the disabled OFF state.

21 Claims, 6 Drawing Sheets

THREE-VOLT TIA/EIA-485 DRIVER CIRCUIT

This application claims priority under 35 USC §119(e)(1) of provisional application Serial No. 60/217,814, filed Jul. 12, 2000.

BACKGROUND OF THE INVENTION

1. Field of the Invention

The present invention relates to binary signal generators used in multipoint interconnection of digital equipment and more specifically to low voltage generators that meet the TIA/EIA-485 standard.

2. Description of the Related Art

The TIA/EIA-485 specification is an industry standard, which specifies the voltage, current, and resistance values of generators and receivers used in the interchange of binary signals in multipoint interconnection of digital equipment, as well as in high-speed transmission of data over SCSI (Small Computer System Interface) busses. An example of a typical application would be the interface between a SCSI hard drive and a host computer. The TIA/EIA-485 standard specifies that this circuit shall provide a minimum output voltage of 1.5 volts. In addition, as illustrated in FIG. 1, the specification specifies that during either the ON or OFF state the driver shall withstand voltages in the range of −7 to +12 volts applied to the driver's output with no damage to the circuit and with leakage currents limited to between −0.8 and +1.0 mA.

FIG. 2 is a block diagram of a typical TIA/EIA-485 transceiver circuit that is comprised of a generator 20, which the circuit of this invention addresses, that is terminated in a 60-ohm resistor 21 and a remote receiver 22. The circuit typically operates with a $V_{CC}$ voltage of +5 volts and provides a minimum differential voltage $V_{t2}$ across the terminating resistor 21 of 1.5 volts for both logic 1 or logic 0 inputs. Also, whether ON or in the tri-state (OFF) condition, the circuit must withstand voltages at the generator's output from −7V to +12V.

FIG. 3 is a block diagram for testing the generator of this invention according to the TIA/EIA-485 specification. The test is performed during ON state for voltage output differential (VOD), but also must withstand −7V to +12V applied to the output during both the ON state and tri-state. The circuit consists of a generator 30, a terminating 60-ohm resistor 31 connected in parallel with two additional 375-ohm resistors 32–33. For test purposes, the center point of these two 375 ohm resistors 32–33 is connected to a voltage source 34, that can be varied between −7.0V and +12V to simulate common-mode voltages applied to the circuit's output. A series current meter 35 is added in series with the voltage source 34 for the purpose of measuring the current in circuit. The TIA/EIA-485 specification specifies that the magnitude of the differential output voltage $V_{t2}$, measured between the two output terminals during ON state, shall not be less than 1.5 volts nor greater than 5.0 volts and that the circuit's output will withstand voltages in the range of −7.0V to +12.0V while in both the ON state and tri-state. The test is performed for both logic 0 and logic 1 input states.

FIG. 4 is a schematic for a typical TIA/EIA-485 generator circuit 20. The circuit consist of an A-terminal 485-driver PMOS/NMOS transistor pair 40 and a B-terminal 485-driver PMOS/NMOS transistor pair 41 that source and sink current to a 60-ohm load resistor 42. The input signal to the B-terminal driver 41 is inverted relative to the A-terminal driver 40 by means of an inverter 43 such that the two drivers 40–41 operate out-of-phase; i.e., the circuit sources and/or sinks currents according to the following state table for the circuit inputs:

| $E_n$ | $I_n$ | A-terminal Driver 40 | B-terminal Driver 41 |
|---|---|---|---|
| 1 | 0 | Sources I | Sinks I |
| 1 | 1 | Sinks I | Sources I |

In operation, when the circuit is enabled ($E_n$=1) and the input level is a logic 0 ($I_n$=0) the A-terminal driver 40 sources current while the B-terminal driver 41 sinks current. Similarly, when the input level is a logic 1 ($I_n$=1) the A-terminal driver 40 sinks current while the B-terminal driver 41 sources current. Also shown are the two 375-ohm resistors 44–45, a −7V to +12V voltage source 46, and a current meter 47 used in testing the circuit.

FIG. 5 is a block diagram showing one of the two 485-driver circuits (40–41) discussed above. Each driver circuit 40–41 consists of a current sourcing transistor 50 and a current sinking transistor 51. The current sourcing transistor 50 is typically a PMOS (p-channel) transistor while the current sinking transistor 51 is a NMOS (n-channel) transistor, although PNP and NPN bipolar transistors can also be used. The circuit further comprises input logic circuitry, as well as a sourcing pre-driver (inverter) 56 and a sinking pre-driver (inverter) 58. The sourcing logic has an NOR gate 55 with inputs being the $I_n$ and $E_n^*$ signals. The sinking logic is comprised of a NAND gate 57 with inputs $E_n$ and $I_n$. The $E_n$ signal is generated by inverting the $E_n^*$ signal by means of an inverter 54. During either the ON state or the disabled (OFF) state, excessive voltages can be applied to the output, turning ON the output stage transistors or their back gate diodes allowing current to flow into or out of $V_{CC}$/Gnd. To prevent this from happening, Schottky diodes 52 and 53 are typically added in series with transistors 50 and 51, respectively, as reverse current blocking devices; i.e., the upper diode 52 is used to prevent leakage current from flowing into $V_{CC}$ if the p-channel transistor's 50 back-gate diode is turned ON when excessive voltage is applied to the circuit output during the off state. Similarly, the lower diode 53 is used to prevent leakage current from flowing from GND if the n-channel transistor's 51 back-gate is turned ON when excessive voltage is applied to the circuits output during the disabled-state. However, because these diodes are in the signal path, they must be large in order to handle the sourcing and/or sinking current, and as a result a significant voltage drop occurs across them, limiting the differential output voltage swing of the driver. This output voltage drop may be tolerable in high voltage (+5V $V_{CC}$) supply applications, but there is a problem maintaining the required 1.5V differential output for the low voltage (+3V $V_{CC}$) system applications addressed by this invention.

The state chart for the typical 485-driver circuit of FIG. 5 is as follows:

| $E_n$ | $I_n$ | PMOS Transistor 50 | NMOS Transistor 51 | |
|---|---|---|---|---|
| 1 | 0 | Sources I | OFF | Enabled |
| 1 | 1 | OFF | Sinks I | Enabled |

-continued

| $E_n$ | $I_n$ | PMOS Transistor 50 | NMOS Transistor 51 | |
|---|---|---|---|---|
| 0 | 0 | OFF | OFF | Inhibited |
| 0 | 1 | OFF | OFF | Inhibited |

As shown, when the driver circuit is enabled (turned ON), either the p-channel transistor sources current from $V_{CC}$ or the n-channel transistor sinks current to GND, depending on the binary state of the input signal $I_n$. When the driver circuit is inhibited (turned OFF), both the p-channel and n-channel transistors are OFF.

FIG. 6 is a schematic for a typical 485-driver circuit 40–41. Comparing this to the block diagram discussed above, the circuit is comprised of an $E_n$ signal inverter 66, current sourcing logic circuitry 64 and current sinking logic circuitry 65, current sourcing pre-driver circuits 62, current sinking pre-driver circuit 63, current output sourcing driver 60, and the current output sinking driver 61. The current sourcing driver 60 consists of a Schottky diode 600 in series with a p-channel transistor 601, while the current sinking driver 61 consists of a Schottky diode 610 in series with a n-channel transistor 611. The sourcing and sinking pre-driver circuits 62–63 are basically inverters consisting of p-channel/n-channel transistor pairs 620,630/621–631, respectively. The sourcing logic circuitry 64 is a NOR gate consisting of two p-channel transistors 640–641 and two n-channel transistors 642–643. Similarly, the sinking logic circuitry 65 is a NAND gate consisting of two p-channel transistors 650–651 and two n-channel transistors 652–653. Finally, the $E_n$ signal inverter 66 consists of p-channel transistor 660 and n-channel transistor 661. In operation, since The $E_n$ signal inverter 66 causes the sourcing and sinking halves of the circuit to operate out-of-phase, the circuit's output will either source current if the $I_n$ signal is LO (logic level 0) or sink current if the $I_n$ signal is HI (logic level 1).

Since these conventional TIA/EIA-485 drivers require series blocking Schottky diodes to prevent excessive reverse leakage currents during the driver disabled state, it would require very large devices (large die size) in order to keep the voltage drop across them low enough to maintain the specified 1.5V output differential voltage in applications having only a 3V power supply. Such large device would cause an undesirable degradation in the speed of the circuit. What is needed for these low voltage applications is a circuit that eliminates these series Schottky diodes from the signal path of the output driver. The invention disclosed herein addresses these needs by means of removing the Schottky diodes from the signal path in the output stage and moving them to the pre-driver stage where current levels are much smaller. Additional Schottky diodes are used in the output stage, but not in the signal path where they impact the output differential signal level, to prevent reverse currents from flowing during when the driver is disabled.

SUMMARY OF THE INVENTION

This invention discloses a 485-driver circuit where the Schottky current blocking diodes are removed from the signal path in the output stage and added to the lower current pre-driver stage so that during the disabled-state the output stage is restricted to the back-gate biasing only, which can be controlled by blocking diodes located out of the signal path. This eliminates the typical voltage drop across the Schottky diodes and allows the driver to meet the 1.5 volt differential output voltage specification even when operating in lower power supply voltage (+3V) applications.

Additional transistors are added that keep the output transistors OFF if excessive voltage is applied to the output during high impedance, disabled state. If excessive voltage is applied to the output, these transistors turn ON and couple the voltage to the pre-driver stage where the Schottky diodes prevent leakage current from flowing.

Finally, in a second embodiment of the invention, the NMOS output transistors are used in a stacked configuration so that the output voltage is shared equally between these transistors, limiting the drain to back-gate voltage and thereby meeting circuit requirements using faster, lower voltage NMOS transistors.

DETAILED DESCRIPTION

This invention discloses a 485-driver circuit that meets all the TIA/EIA-485 specification while operating at power supply voltages as low as 3 volts. This circuit will provide a differential output voltage of not less than 1.5V while operating from a 3V $V_{CC}$ supply and will not be damaged by exposing the circuit's output to voltages ranging –7 to +12 volts, while in either the operational or disabled states. The circuit accomplishes these low voltage operating characteristics by eliminating the voltage drop across the series Schottky diodes found in conventional 485-driver circuits. These Schottky blocking diodes are moved to the pre-driver stage where current levels are much smaller, thereby limiting the output stage to only back-gate bias currents during the disabled-state. One embodiment of the invention also uses stacked NMOS transistors, which allows for lower voltage rated transistors then those used in conventional 485 tri-state circuits to be used, thereby resulting in much higher speed operation.

Figure 1:
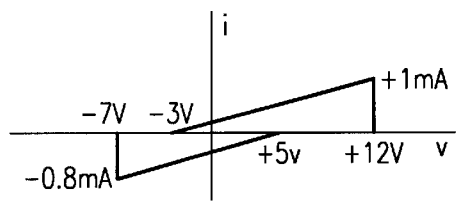
FIG. 1 is a diagram showing the TIA/EIA-485 driver specification voltage and current requirements. (prior art)
Figure 2:
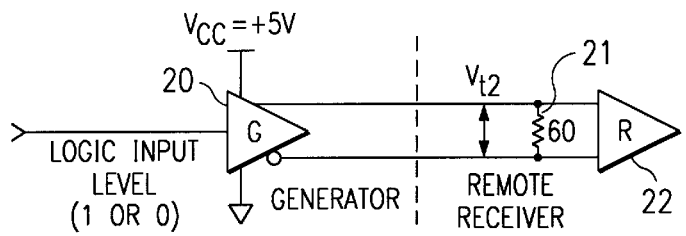
FIG. 2 is a block diagram of a TIA/EIA-485 transceiver, consisting of a generator terminated in 60-ohm and a receiver. (prior art)
Figure 3:
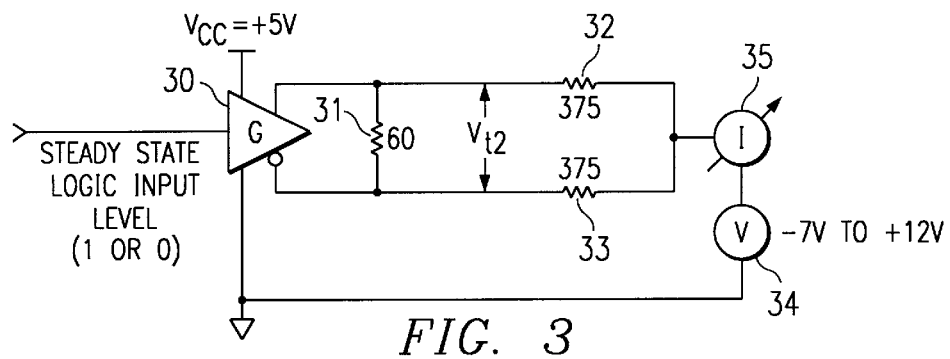
FIG. 3 is a block diagram of a TIA/EIA-485 generator showing the TIA/EIA-485 specification test requirements. (prior art)
Figure 4:
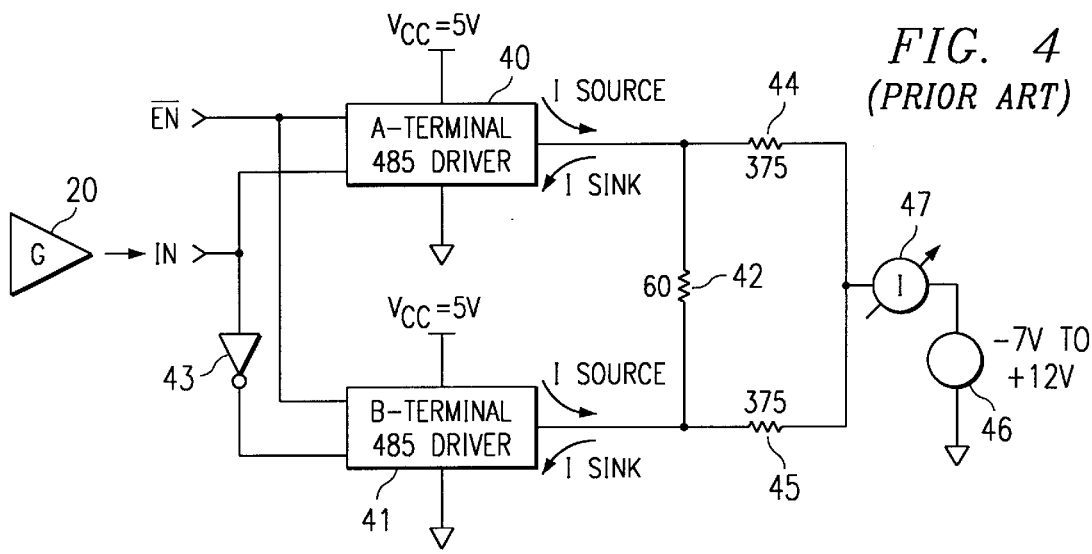
FIG. 4 is a block diagram of a typical TIA/EIA-485 generator consisting of an A-terminal 485-Driver and a B-terminal 485-driver. (prior art)
Figure 5:
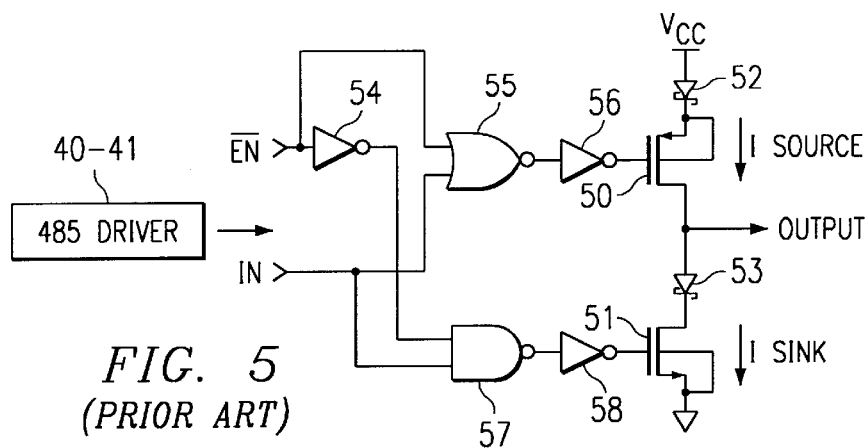
FIG. 5 is a block diagram for a typical TIA/EIA-485 driver circuit. (prior art)
Figure 6:
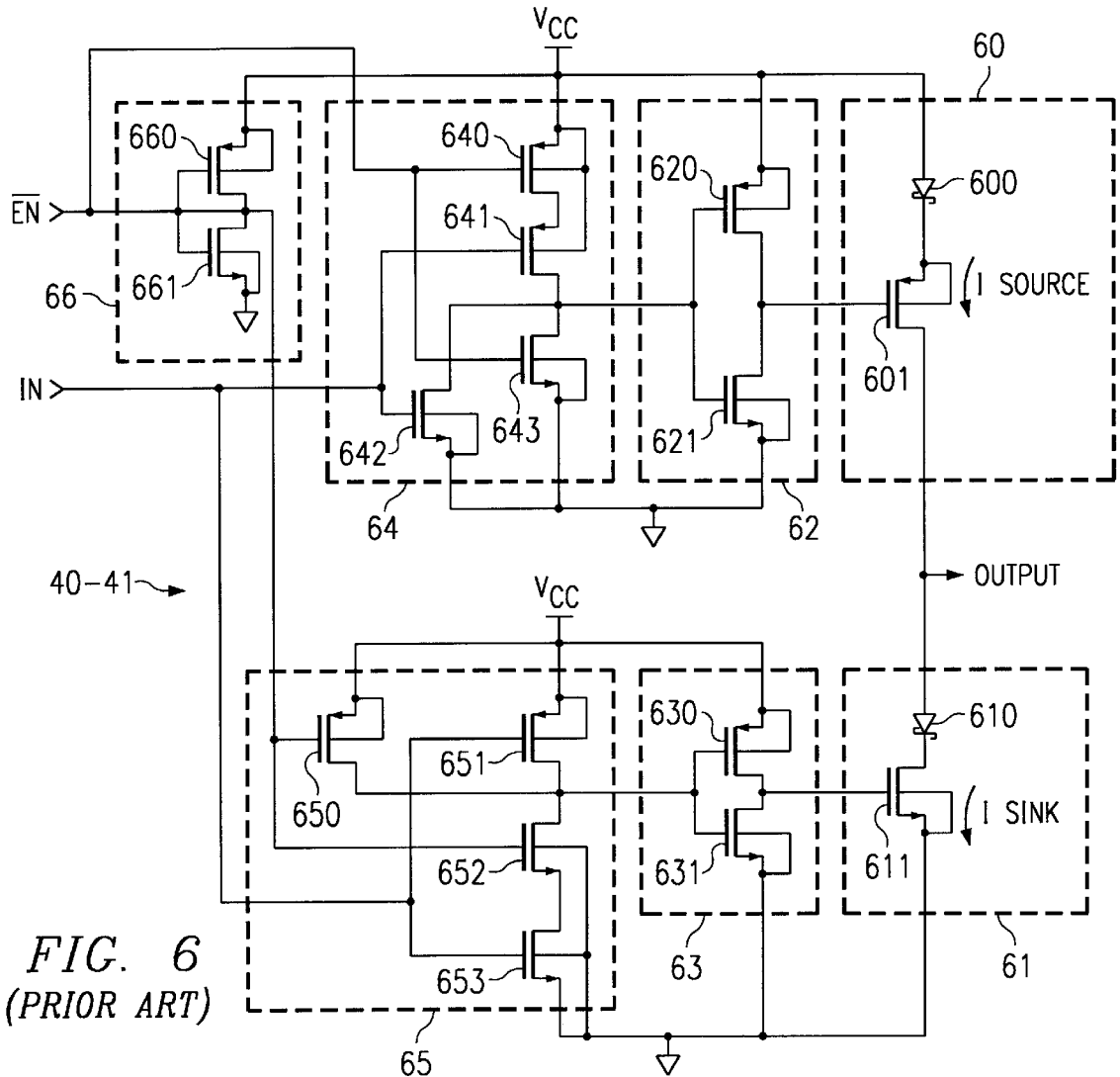
FIG. 6 is a schematic of the typical TIA/EIA-485 driver circuit of FIG. 5. (prior art)
Figure 7:
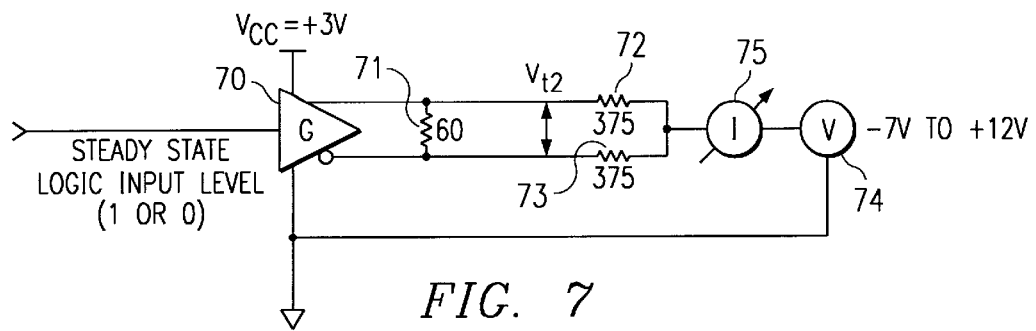
FIG. 7 is a block diagram of the new low voltage TIA/EIA-485 generator of this invention, showing the TIA/EIA-485 specification test requirements.

FIG. 7 is a block diagram for a tri-state generator built around the low voltage TIA/EIA-485 drivers of this invention. The difference in this diagram relative to the conventional circuit of FIG. 3 is that the new circuit operates from a 3V power supply while still meeting all the TIA/EIA-485 test conditions. The circuit consists of a generator 70, a 60-ohm terminating resistor 71 connected in parallel with two additional 375-ohm resistors 72–73. For test purposes, the center point of these two 375 ohm resistors 72–73 is connected to a voltage source 74, that can be varied between −7.0V and +12V to simulate common-mode voltages applied during tri-state. A series current meter 75 is added in series with the voltage source 74 for the purpose of measuring the currents in the circuit. The generator 70 is comprised of two TIA/EIA-485 drivers; i.e., a High-side driver and a Low-side driver.

Figure 8:
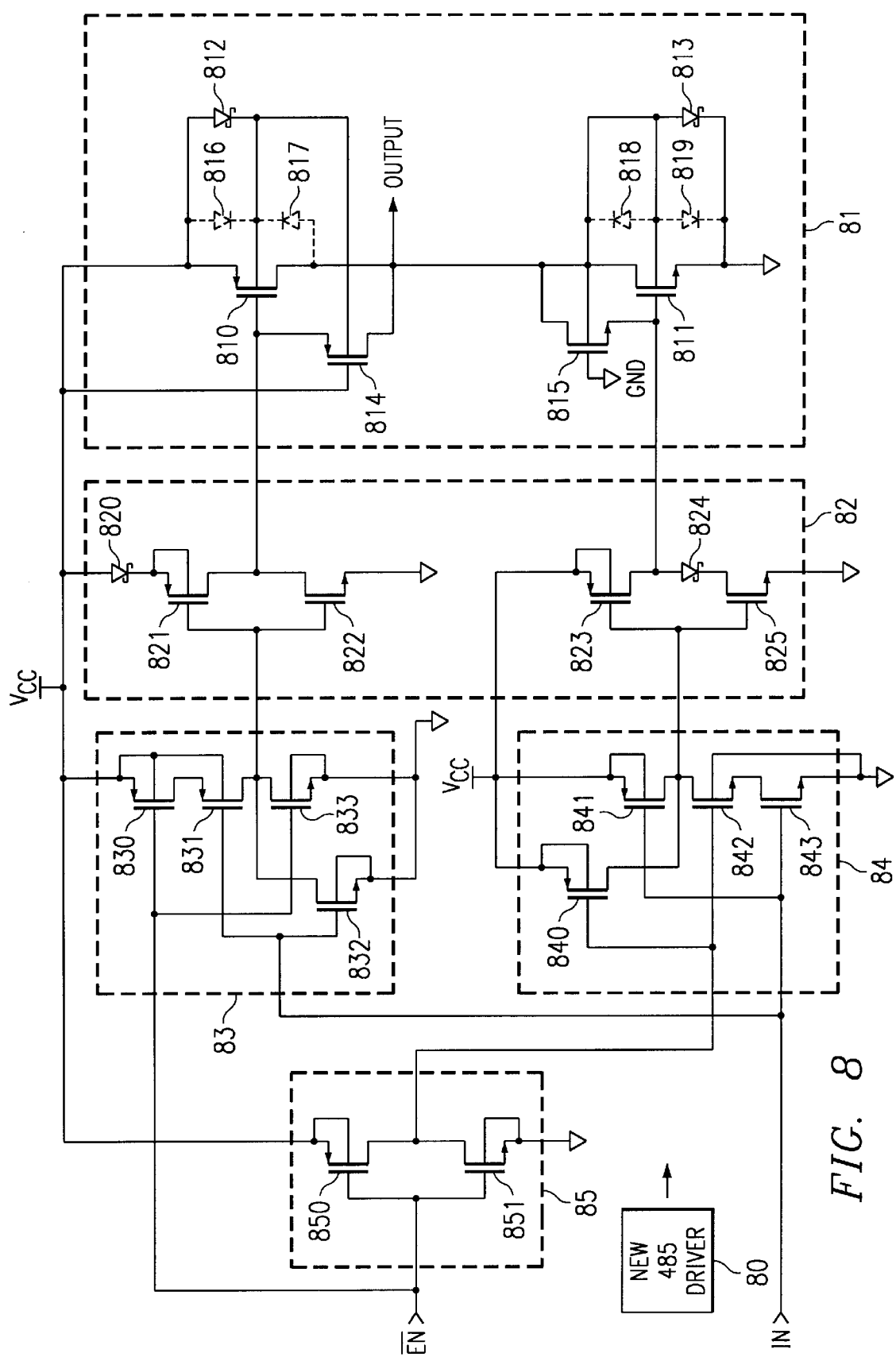
FIG. 8 is a schematic diagram for the basic TIA/EIA-485 driver circuit of this invention.

FIG. 8 is a schematic diagram for the new 3V TIA/EIA-485 driver 80, two of which are used in the generator of this invention. Much like conventional circuits, this circuit is comprised of input logic circuitry 83–85, pre-driver circuitry 82, and the output driver circuitry 81. However, in this case Schottky diodes 820 and 824 have been moved out of the output driver's signal path and placed in the much lower current pre-driver stage. Also, Schottky diodes 812 and 813 have been added to the output driver stage 81 to prevent the back-gate diode from turning ON during the disabled state, but these are no longer in the signal path. By moving these Schottky diodes out of the signal path, the relatively large voltage drop across the diodes is eliminated, thereby allowing the circuit to maintain a differential output voltage of 1.5 volts while operating at $V_{CC}$ voltages as low as 3.0 volts. However, additional components are needed to assured that the circuit is not damaged if the output has a voltage in the range of +12V to −7V applied to it while in the disabled (OFF) state.

In this new circuit, the output driver circuitry 81 consists of an High-side driver comprised of two p-channel transistors 810, 814 and a back-gate Schottky diode 812, and a Low-side driver comprised of two n-channel transistors 811, 815 and a back-gate Schottky diode 813. Also, shown (dotted line) are inherent back-gate diodes 816–817 and 818–819 associated with p-channel transistor 810 and n-channel transistor 811, respectively. The pre-driver stage 82 also consists of an High-side and a Low-side pre-driver. The High-side pre-drive stage is comprised of a p-channel transistor 821, a n-channel transistor 822, and a Schottky diode 820, which is located in this much lower current signal path. Similarly, the Low-side pre-drive stage is comprised of a p-channel transistor 823, a n-channel transistor 825, and a Schottky diode 824, which is also in the lower current signal path. Finally, the NOR gate 83 is comprised of two p-channel transistors 830–831 and two n-channel transistors 832–833, as shown. The NAND gate 84 is comprised of two p-channel transistors 840–841 and two n-channel transistors 842–843. An inverter 85, made up of p-channel transistor 850 and n-channel transistor 851 is used to provide the En from the $E_n^*$ ($E_n$ barred) signal. Both an $I_n$ and $E_n^*$ signal are supplied to the circuit. When connected as shown, the High-side logic circuitry performs a NOR function and the Low-side logic circuitry performs a NAND function. There are primarily three improvements made to this circuit compared to the conventional circuit; i.e., 1. the Schottky diodes 820, 824 are moved from the output driver's signal path and placed in the pre-driver's signal path where the current level is much lower, allowing a 1.5V differential output while operating from a +3V supply,
2. the back-gate Schottky diodes 812, 813 are included to prevent output transistor's 810, 811 back-gate diodes 817, 818 from turning ON, and
3. transistors 814, 815 are added to prevent transistors 810, 811 from turning ON, respectively, when excessive voltage is applied to the output during the disabled-state state by coupling the applied voltage to the pre-driver stage and keeping transistor's 810, 811 gate-to-drain voltages equal zero.

In operation, Schottky diode 812 prevents the p-channel transistor's 810 back-gate diode from turning ON. This Schottky diode will block current to $V_{CC}$ if inherent diode 817 attempts to turn ON. Also, P-channel transistor 814 serves to keep p-channel transistor 810 OFF when +12V to −7V is applied to the output. In this circuit, when excessive positive voltage is applied to the output during the OFF state, transistor 814 will turn ON and couple the output voltage to the pre-driver stage, where the series blocking Schottky diode 820 is now located, to prevent leakage current from flowing to $V_{CC}$. Again, the advantage of placing the Schottky diodes in the pre-driver stage is that they don't limit the output voltage and they can be smaller in size, making the circuit faster, since there is no DC current flowing through them. Similarly, when excessive negative voltage is applied to the output during the OFF state, transistor 815 will turn ON and couple the output voltage to the pre-driver stage, where the series blocking Schottky diode 824 is located, to prevent leakage current from flowing from GND.

The state table for the typical 485-driver circuit of FIG. 8 is as follows:

| $E_n$ | $I_n$ | PMOS Transistor 50 | NMOS Transistor 51 | |
|---|---|---|---|---|
| 1 | 0 | Sources I | OFF | Enabled |
| 1 | 1 | OFF | Sinks I | Enabled |
| 0 | 0 | OFF | OFF | Inhibited |
| 0 | 1 | OFF | OFF | Inhibited |

As shown, when the driver circuit is enabled (turned ON), either the p-channel transistor sources current from $V_{CC}$ or the n-channel transistor sinks current to GND, depending on the binary state of the input signal $I_n$.

Figure 9:
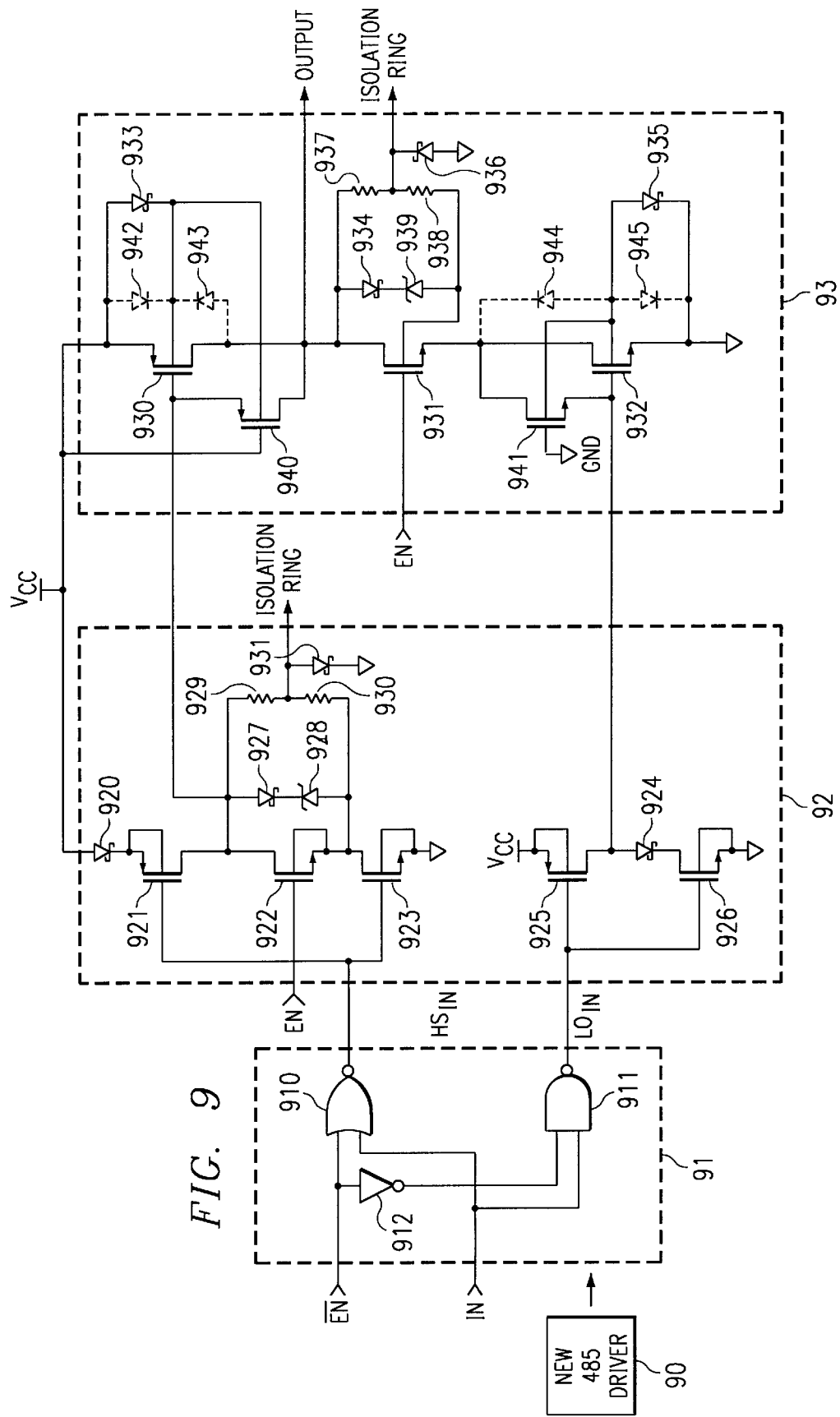
FIG. 9 is a schematic for a version of the TIA/EIA-485 driver circuit of this invention, which uses stacked n-channel transistors to prevent hot-carrier injection in the NMOS devices by keeping the voltage low across them.

In the Low-side drivers of FIG. 8 where NMOS transistors are involved, exceeding the maximum drain-to-back gate voltage on the transistor can result in the hot-carrier injection phenomenon when voltages exceed approximately 11 volts. To prevent hot-carrier injection, NMOS transistors are stacked so that the voltage is divided equally across the two NMOS transistors and will be no more than 7 volts across any NMOS transistor, thereby preventing hot-carrier injection. FIG. 9 is a schematic diagram for an embodiment of the 3V TIA/EIA-485 driver 90 with these stacked n-channel transistors. This circuit is comprised of input logic circuitry 91, pre-driver circuitry 92, and the output driver circuitry 93. As in FIG. 8, Schottky diodes 920 and 924 have been moved out of the output driver's signal path and placed in the much lower current pre-driver stage and Schottky diodes 933–936 have been added to the output driver stage 93 to prevent the back-gate diode from turning ON during the disabled-state. This circuit is comparable to that of FIG. 8 with the exception that provision is made to keep the voltage of all n-channel transistor equal or less than 7 volts.

In this version of the new circuit, the output driver circuitry 93 consists of a High-side diver comprised of two p-channel transistors 930, 940 and a back-gate Schottky diode 933, and a Low-side driver comprised of three n-channel transistors 931–932, 941, three Schottky diodes 934–936, two resistors 937–938 and a zener diode 939. Also shown are the inherent back-gate diode 942–943 and 944–945 for transistor4s 930 and 932, respectively. The High-side pre-drive stage 92 is comprised of a p-channel transistor 921, two n-channel transistors 922–923, three Schottky diodes 920, 927, 931, two resistors 929–930, and a zener diode 928. The Low-side pre-driver stage is comprised of a p-channel transistor 925, a n-channel transistor 926, and a Schottky diode 924. Finally, the logic circuitry 91 is comprised of a 2-input NOR gate 910 with $E_n$ and $I_n$ input signals, which drives the High-side pre-drive stage and a 2-input AND gate 911, with $E_n^*$ ($E_n$ barred) and $I_n$ input signals, which drives the Low-side pre-drive stage. An inverter 912 is used to provide the $E_n$ to the AND gate 911 by inverting the $E_n^*$ signal.

The primarily improvements of this circuit over that of FIG. 8 is that the n-channel transistors are stacked to assure that no more than 7 volts is applied across then. Otherwise, the basic operation of the circuit is the same. The main difference in the circuit from that of FIG. 8 is that n-channel transistors 811 and 822 in the output driver and pre-driver stages are replaced by stacked n-channel transistor pairs 931–932 and 922–923, respectively. Also, 10-volt zener diodes 939 and 928 are added, along with voltage divider resistors 937–938 and 929–930, whose center tap provides a 5-volt level for the transistor's isolation ring. Finally, Schottky diodes 936 and 931 prevent the isolation ring from going negative when −7V is applied to the output in the OFF state. In operation, if the output sees voltages above 10V, diode 939 (or diode 928 in pre-driver stage) will turn on and clamp the drain-to-source voltage of n-channel transistor 931 (or transistor 922 in pre-driver stage). Any further increase in output voltage will appear across n-channel transistor 932 (or transistor 923 in pre-driver stage). This limits the drain-to-source voltage of these NMOS transistors to 10 volts.

Figure 10:
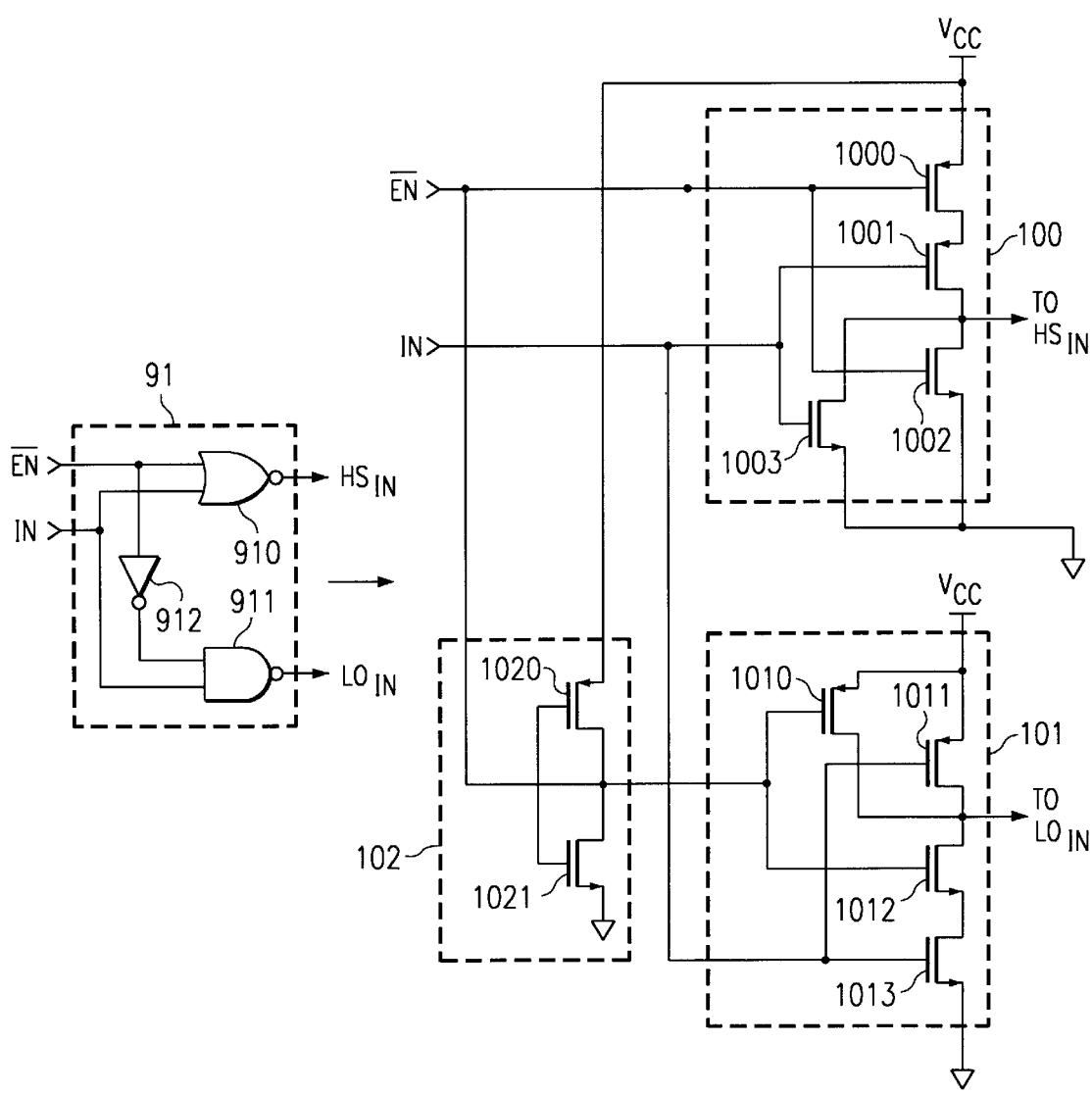
FIG. 10 is a schematic of the front-end control logic for the TIA/EIA-485 driver circuit of FIG. 5.

FIG. 10 is a schematic for one implementation of the front-end logic 91 in the circuit of FIGS. 8 & 9. Here, the 2-input NOR gate 100 is comprised of p-channel transistors 1000–1001 and n-channel transistors 1002–1003. The 2-input NAND gate 101 is comprised of p-channel transistors 1010–1011 and n-channel transistors 1012–1013. The inverter 102 is comprised of p-channel transistor 1020 and n-channel transistor 1021. The output of this logic circuitry provides the input control signals to the High-side and Low-side pre-driver circuitry.

Figure 11:
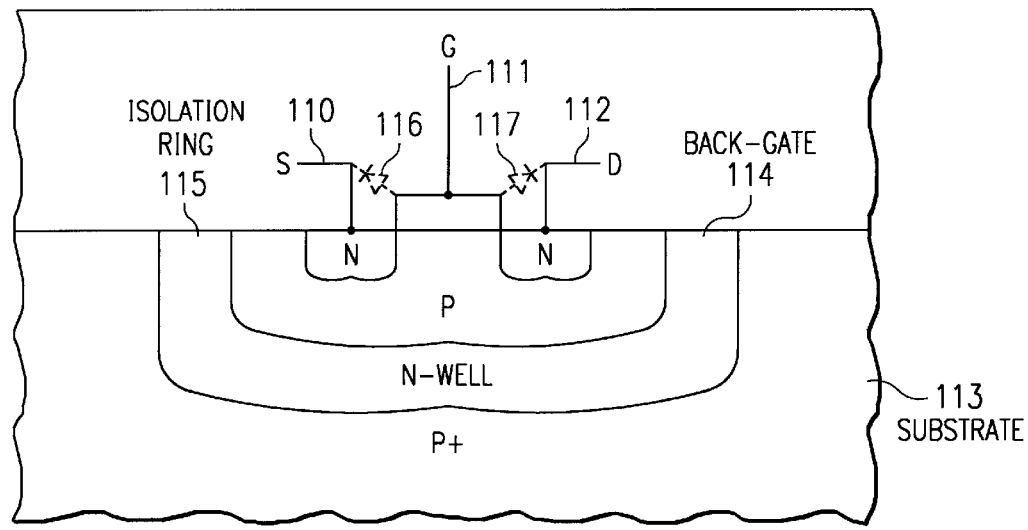
FIG. 11 is diagram illustrating the back-gate isolation technique used in the TIA/EIA-485 driver of this invention.

FIG. 11 is a diagram illustrating the back-gate and isolation ring used in the MOS transistors of this invention. The transistor is comprised of a source 110, a gate 111, a drain 112, a substrate connection 113, a back-gate 114 connection, and a n-well isolation ring 155. Also shown are the inherent diodes 116 and 117 between the back-gate source and drain, respectively. Normally the p+ substrate is tied to GND, but in this case it is tied to the back-gate potential, which is different from GND, so the isolation ring is required.

Figure 12:
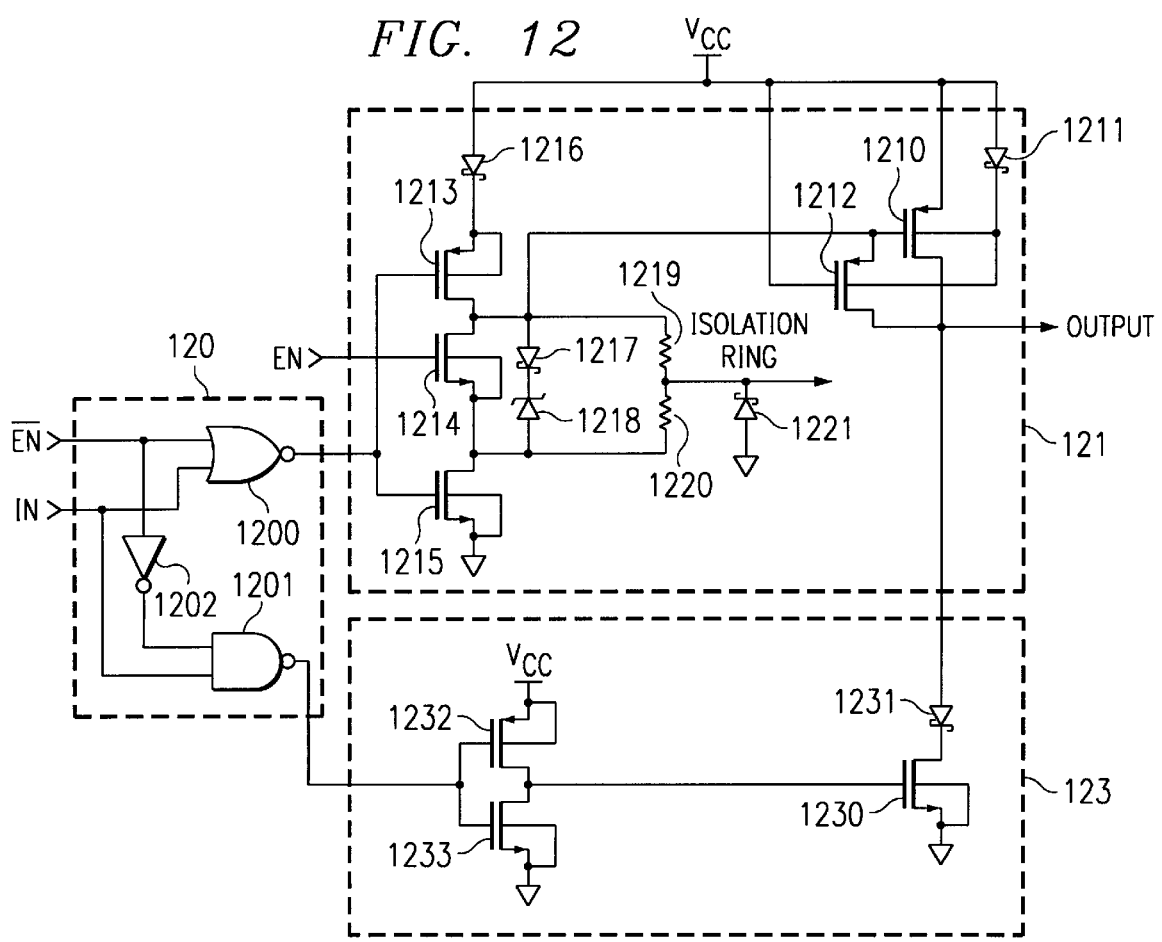
FIG. 12 is a schematic for a TIA/EIA-485 tri-state driver that uses a Schottky diode in the lower NMOS path at the expense of making the upper PMOS driver larger to compensate for the loss in output differential voltage. (applies to both A-terminal and B-terminal drivers)

FIG. 12 is a schematic for another embodiment of the driver circuit that can be used in intermediate voltage (3.5–4.5 volts) applications. However, this version of the circuit can also be used in low voltage (3.0 volt) applications, but at the expense of larger output geometries and lower speed. This embodiment uses the circuit of this invention (either that of FIG. 8 or FIG. 9) for the High-side driver, which removes the Schottky diode out of the signal path, but uses the conventional driver circuit for the Low-side driver, where the Schottky diode remains in the signal path. This eliminates one Schottky diode voltage drop instead of eliminating both Schottky diode drops as discussed in the earlier circuits. In this case, the circuit is comprised of logic circuitry 120, a High-side pre-driver circuit 121 of this invention, and a conventional Low-side driver circuit 123. As in FIG. 9, the High-side output driver circuit 121 is comprised of a p-channel transistor 1210, a n-channel transistor 1212, and a back-gate Schottky diode 1211. The High-side pre-driver circuit is comprised of a p-channel transistor 1213, two stacked n-channel transistors 1214–1215, a Schottky diode 1216 in the signal path, a 10 volt zener diode 1218, two additional Schottky diodes 1217,1221, and a voltage divider consisting of two resistors 1219–1220. The conventional Low-side output driver 123 is comprised of a n-channel transistor 1230 and an in the signal path current blocking Schottky diode 1231. The Low-side pre-driver is an inverter consisting of a p-channel transistor 1232 and a n-channel transistor 1233. Finally, the input logic circuitry 120 is comprised of a of a 2-input NOR gate 1200 with $E_n^*$ ($E_n$ barred) and $I_n$ input signals, which drives the High-side pre-drive stage and a 2-input AND gate 1201, with $E_n$ and $I_n$ input signals, which drives the Low-side pre-drive stage. An inverter 1202 is used to provide the $E_n$ signal to AND gate 1201 by inverting the $E_n^*$ signal.

While this invention has been described in the context of two preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A TIA/EIA-485 tri-state driver, which provides a differential output voltage of 1.5 volts from a low voltage power supply, comprising:

an output driver stage comprising an High-side output driver and a Low-side output driver, without blocking diodes in a signal path thereof;

a pre-driver stage consisting of a High-side pre-driver and a Low-side pre-driver, with first Schottky blocking diodes in a low current signal path thereof; and input signal logic circuitry.

2. The TIA/EIA-485 tri-state driver of claim 1 that operates from a 3-volt power supply.

3. The TIA/EIA-485 tri-state driver of claim 1, wherein the High-side output driver and the Low-side output driver comprise MOS transistors, said tri-state driver further comprising second Schottky blocking diodes in said output driver stage, connected between the back-gate and the source of said MOS transistors.

4. The TIA/EIA-485 tri-state driver of claim 3, further comprising turn-off transistors connnected to prevent said transistors of said output driver stage from turning ON and leaking current during a disabled-state.

5. The TIA/EIA-485 tri-state driver of claim 1, wherein said output driver stage further comprises:

a first and second p-channel transistor;

a first and second n-channel transistor; and a first and second Schottky diode located out of the output signal path.

6. The TIA/EIA-485 tri-state driver of claim 5, wherein
said first p-channel transistor is the High-side output driver;
said first n-channel transistor is the Low-side output driver;
said second p-channel transistor prevents said first p-channel transistor from turning ON and leaking current during said disabled-state;
said second n-channel transistor prevents said first n-channel transistor from turning ON and leaking current during said disabled-state; and
said first and second Schottky diodes are connected to prevent back-gate current from flowing during said disabled-state.

7. The TIA/EIA-485 tri-state driver of claim 6, wherein
the source of said first p-channel transistor is connected to the anode of said first Schottky diode and to a 3V $V_{CC}$ supply voltage;
the drain of said first p-channel transistor is connected to the drain of said second p-channel transistor, to the drain of said first and second n-channel transistors, and to said tri-state driver's differential output;
the gate of said first p-channel transistor is connected to the source of said second p-channel transistor and to the High-side output driver input;
the gate of second p-channel transistor is connected to the $V_{CC}$ supply voltage;
the cathode of said first Schottky diode is connected to the back-gate of said first and second p-channel transistors;
the source of said first n-channel transistor is connected to the cathode of said second Schottky diode and to the circuit ground;
the gate of said first n-channel transistor is connected to the source of said second n-channel transistor and to the Low-side output driver input;
the gate of said second n-channel transistor is connected to the circuit ground; and
the anode of said second Schottky diode is connected the back-gate of said first and second n-channel transistors.

8. The TIA/EIA-485 tri-state driver of claim 1, wherein said pre-driver stage further comprises:
a first and second p-channel transistor;
a first and second n-channel transistor; and
a first and second Schottky diode located in the low current signal path.

9. The TIA/EIA-485 tri-state driver of claim 8 wherein
the anode of said first Schottky diode is connected to a 3V supply voltage;
the cathode of said first Schottky diode is connected to the source and back-gate of said first p-channel transistor;
the drain of said first p-channel transistor is connected to the drain of said first n-channel transistor, and to the High-side pre-driver output;
the gates of said first p-channel transistor and said first n-channel transistor are connected together and to the High-side pre-driver input;
the source of said first n-channel transistor is connected to the circuit ground;
the source and back-gate of said second p-channel transistor are connected together and to the 3V supply voltage;
the gates of said second p-channel transistor and said second n-channel transistor are connected together and to the Low-side pre-driver input;
the drain of said second p-channel transistor is connected to the anode of said second Schottky diode and to the Low-side pre-driver output;
the drain of said second n-channel transistor is connected to the cathode of said second Schottky diode; and
the source and back-gate of said second n-channel transistor are connected together and to the circuit ground.

10. The TIA/EIA-485 tri-state driver of claim 1 wherein said input signal logic circuitry further comprises:
a NOR gate;
a NAND gate; and
an inverter.

11. The TIA/EIA-485 tri-state driver of claim 10, wherein
the first input of said NOR gate is connected to the input of said inverter and to an inverted enable input signal;
the second input of said NOR gate is connected to the first input of said NAND gate and to a logic input signal;
the output of said inverter is connected to the second input of said NAND gate;
the output of said NOR gate is connected to the High-side pre-driver input; and
the output of said NAND gate is connected to the Low-side pre-driver input.

12. The TIA/EIA-485 tri-state driver of claim 1, which prevents hot-carrier injection in NMOS transistors of said Low-side pre-driver by:
stacking two NMOS transistors; and
limiting the voltage across each said NMOS transistor to no more than 7 volts.

13. The TIA/EIA-485 tri-state driver of claim 12, which has a n-well ring that isolates the p-type back-gate of said NMOS transistors from the p+ type substrate.

14. The TIA/EIA-485 tri-state driver of claim 13, which supplies 5 volts to said isolation ring by means of a 10-volt zener diode and a voltage divider.

15. The TIA/EIA-485 tri-state driver of claim 14, wherein said output driver stage further comprises:
a first and second p-channel transistor;
a first, second, and third n-channel transistor;
a first, second, third, and fourth Schottky diode;
a zener diode; and
two resistors.

16. The TIA/EIA-485 tri-state driver of claim 15, wherein
said first p-channel transistor is the High-side pre-driver;
said first and second n-channel transistors make up the stacked Low-side pre-driver;
said second p-channel transistor prevents said first p-channel transistor from turning ON and leaking current during a disabled-state;
said third n-channel transistor prevents said first n-channel transistor from turning ON and leaking current during the disabled-state;
said first, second, and third Schottky diodes prevent back-gate current from flowing during the disabled-state;
said 10V zener diode and said first and second resistors limit voltage across said first and second n-channel transistors to be less than 7 volts;
said first and second resistors provide 5 volts to said isolation ring; and said fourth Schottky diode prevents said isolation ring from going negative when −7 volts is applied to said tri-state driver's output during the disabled-state.

17. The TIA/EIA-485 tri-state driver of claim 16, wherein the source of said first p-channel transistor is connected to the anode of first said Schottky diode and to a 3V $V_{CC}$ supply voltage;

the drain of said first p-channel transistor is connected to the drain of said second p-channel transistor, to the drain of said first n-channel transistor, to the a node of said second Schottky diode, to the first terminal of said first resistor, and to said tri-state driver's differential output;

the gate of said first p-channel transistor is connected to the source of said second p-channel transistor and to the High-side pre-driver input;

the gate of second p-channel transistor is connected to the $V_{CC}$ supply voltage;

the cathode of said firs t Schottky diode is connected to the back-gates of said first and second p-channel transistors;

the source of said first n-channel transistor is connected to the drains of said second and third n-channel transistors;

the gate of said second n-channel transistor is connected to the source of said third n-channel transistor and to the Low-side pre-driver input signal;

the gate of said third n-channel transistor is connected to the circuit ground;

source of said second n-channel transistor is connected to the cathode of said third Schottky diode and to the circuit ground;

the anode of said third Schottky diode is connected to the back-gates of said third and fourth n-channel transistors;

the second terminal of said first resistor is connected to the first terminal of said second resistor, to the cathode of said fourth Schottky diode, and to the isolation ring output;

the cathode of said second Schottky diode is connected the cathode of said first zener diode;

the anode of said first zener diode is connected to the second terminal of said second resistor and to the back-gate of said first n-channel transistor;

the anode of said fourth Schottky diode is connected to the circuit ground.

18. The TIA/EIA-485 tri-state driver of claim 14, wherein said pre-driver stage further comprises:

a first and second p-channel transistor;

a first, second, and third n-channel transistor;

first and second Schottky diodes located in the low current signal path;

third and fourth Schottky diodes;

a zener diode; and two resistors.

19. The TIA/EIA-485 tri-state driver of claim 18 wherein the anode of said first Schottky diode is connected to a 3V supply voltage;

the cathode of said first Schottky diode is connected to the source and back-gate of said first p-channel transistor;

the drain of said first p-channel transistor is connected to the drain of said first n-channel transistor, to the anode of said second Schottky diode, to the first terminal of said first resistor, and to the High-side output driver signal output;

the cathode of said second Schottky diode is connected to the cathode of said first zener diode;

the gate of said first p-channel transistor is connected to the gate of said second n-channel transistor and to the High-side output driver input signal;

the second terminal of said first resistor is connected to the first terminal of said second resistor, to the cathode of said third Schottky diode, and to the isolation ring output;

the anode of said third Schottky diode is connected to the circuit ground;

the source of said first n-channel transistor is connected to the drain of said second n-channel transistor, to the anode of said zener diode, to the second terminal of said second resistor, and to the back-gate of said first n-channel, transistor;

the source and back-gate of said second n-channel transistor connected together and to the circuit ground;

the source and back-gate of said second p-channel transistor are connected together and to the 3V supply voltage;

the gates of said second p-channel transistor and said third n-channel transistor are connected together and to Low-side output driver input signal;

the drain of said second p-channel transistor is connected to the anode of said fourth Schottky diode and to the Low-side output driver output signal;

the drain of said third n-channel transistor is connected to the cathode of said fourth Schottky diode; and the source and back-gate of said third n-channel transistor is connected together and to the circuit ground.

20. The TIA/EIA-485 tri-state driver of claim 14 wherein said input signal logic circuitry further comprises:

a NOR gate;

a NAND gate; and an inverter.

21. The TIA/EIA-485 tri-state driver of claim 20, wherein the first input of said NOR gate is connected to the input of said inverter and to an inverted enable input signal;

the second input of said NOR gate is connected to the first input of said NAND gate and to a logic input signal;

the output of said inverter is connected to the second input of said NAND gate;

the output of said NOR gate is connected to the High-side pre-driver input; and the output of said NAND gate is connected to the Low-side pre-driver input.

* * * * *